United States Patent
Matsui

(10) Patent No.: US 9,870,923 B2
(45) Date of Patent: Jan. 16, 2018

(54) SEMICONDUCTOR DEVICE AND METHOD OF MANUFACTURING THE SEMICONDUCTOR DEVICE

(71) Applicant: FUJI ELECTRIC CO., LTD., Kawasaki-shi, Kanagawa (JP)

(72) Inventor: Toshiyuki Matsui, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/246,595

(22) Filed: Aug. 25, 2016

(65) Prior Publication Data

US 2016/0365250 A1    Dec. 15, 2016

Related U.S. Application Data

(63) Continuation of application No. PCT/JP2015/072917, filed on Aug. 13, 2015.

(30) Foreign Application Priority Data

Sep. 4, 2014    (JP) ................................. 2014-180373

(51) Int. Cl.
  *H01L 31/119*    (2006.01)
  *H01L 21/22*    (2006.01)
  (Continued)

(52) U.S. Cl.
  CPC ........ *H01L 21/221* (2013.01); *H01L 21/2253* (2013.01); *H01L 21/263* (2013.01); *H01L 21/2636* (2013.01); *H01L 21/26506* (2013.01); *H01L 21/761* (2013.01); *H01L 29/063* (2013.01); *H01L 29/0623* (2013.01); *H01L 29/32* (2013.01); *H01L 29/401* (2013.01); *H01L 29/404* (2013.01); *H01L 29/66136* (2013.01); *H01L 29/8611* (2013.01); *H01L 29/0619* (2013.01); *H01L 29/1602* (2013.01); *H01L 29/1608* (2013.01); *H01L 29/2003* (2013.01)

(58) Field of Classification Search
  CPC ........................... H01L 21/3223; H01L 29/32
  See application file for complete search history.

(56) References Cited

U.S. PATENT DOCUMENTS

2003/0062584 A1    4/2003  Takahashi
2008/0315364 A1    12/2008 Nemoto

FOREIGN PATENT DOCUMENTS

JP    H09-121052 A    5/1997
JP    WO-2007-055352 A1    5/2007
(Continued)

*Primary Examiner* — Samuel Gebremariam
(74) *Attorney, Agent, or Firm* — Rabin & Berdo, P.C.

(57) ABSTRACT

A semiconductor device that includes a p-type region formed selectively along one principle surfaces of an n-type drift layer and having a resistance that is lower than that of the drift layer, and in which, when a depth R at which a vacancy-oxygen complex defect region is provided in the drift layer with a thickness t from a surface of a pn junction being a boundary of the p-type region in a thickness direction of the drift layer from a back surface of a semiconductor substrate, resistivity of the drift layer is ρ, and width W of a depletion layer extending in the drift layer from the pn junction with a reverse bias voltage V to the pn junction is represented as $W=0.54 \times \sqrt{(\rho \times V)}$, the vacancy-oxygen complex defect region is provided at the depth R represented by $0 < R \le t-W$.

2 Claims, 8 Drawing Sheets

(51) Int. Cl.
*H01L 21/225* (2006.01)
*H01L 21/263* (2006.01)
*H01L 21/761* (2006.01)
*H01L 29/06* (2006.01)
*H01L 29/40* (2006.01)
*H01L 29/66* (2006.01)
*H01L 29/861* (2006.01)
*H01L 29/32* (2006.01)
*H01L 21/265* (2006.01)
*H01L 29/16* (2006.01)
*H01L 29/20* (2006.01)

(56) References Cited

FOREIGN PATENT DOCUMENTS

| | | |
|---|---|---|
| JP | 2007-266103 A | 10/2007 |
| JP | 2010-092991 A | 4/2010 |
| WO | WO-99-09600 A1 | 2/1999 |

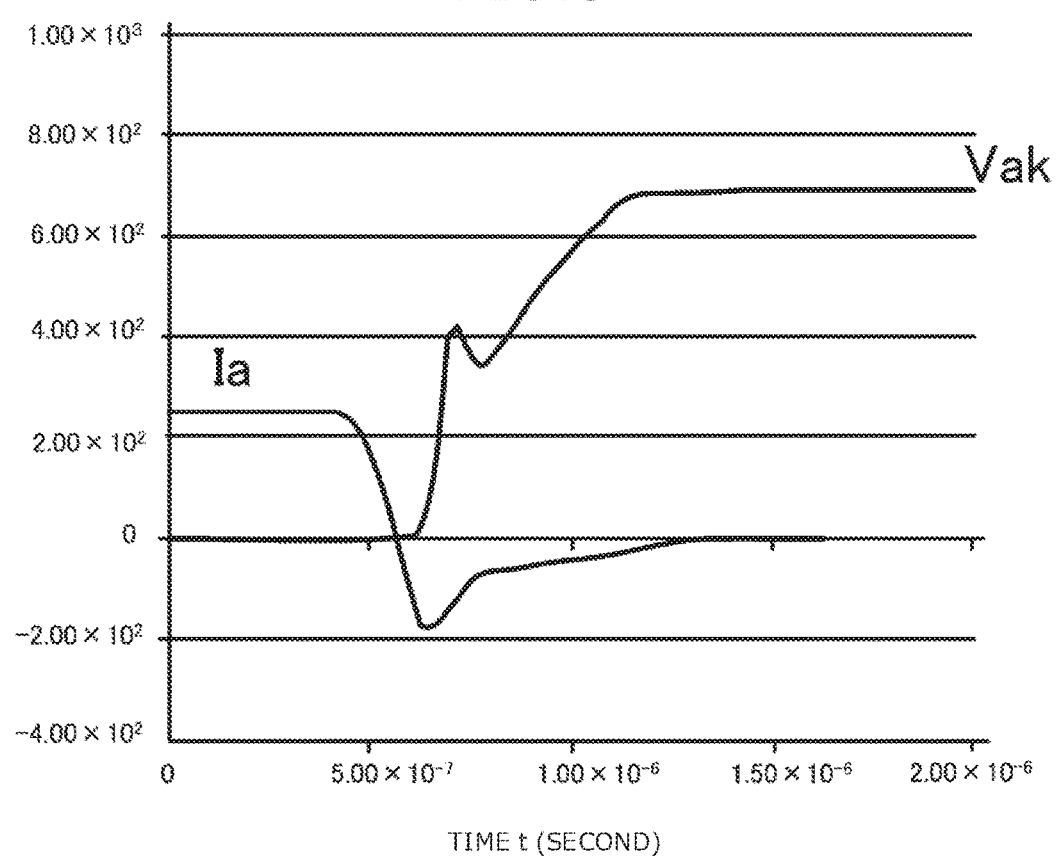

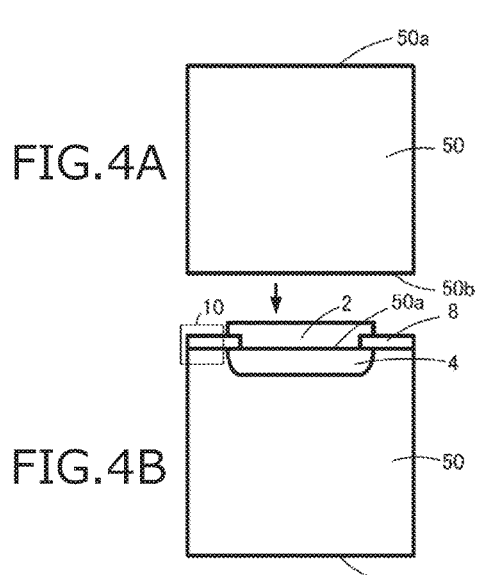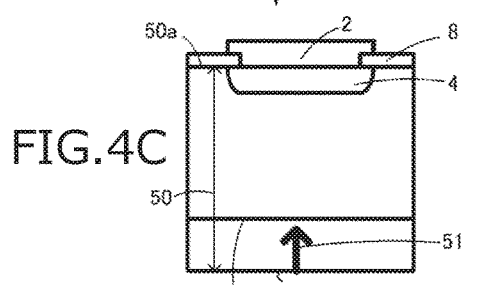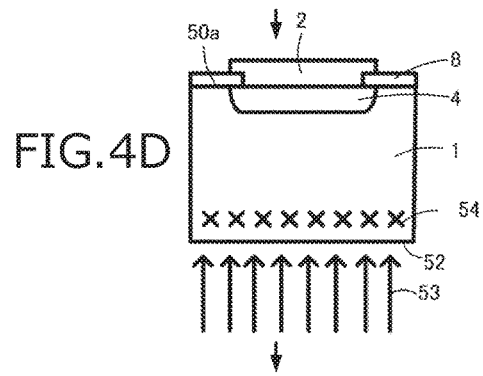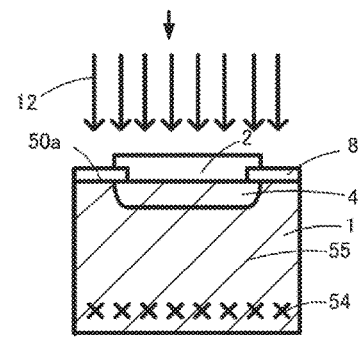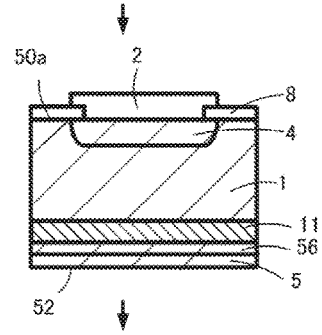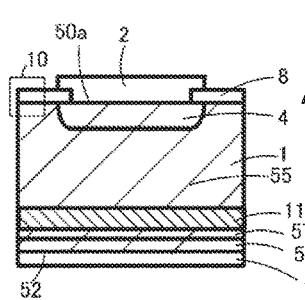

PRIOR ART

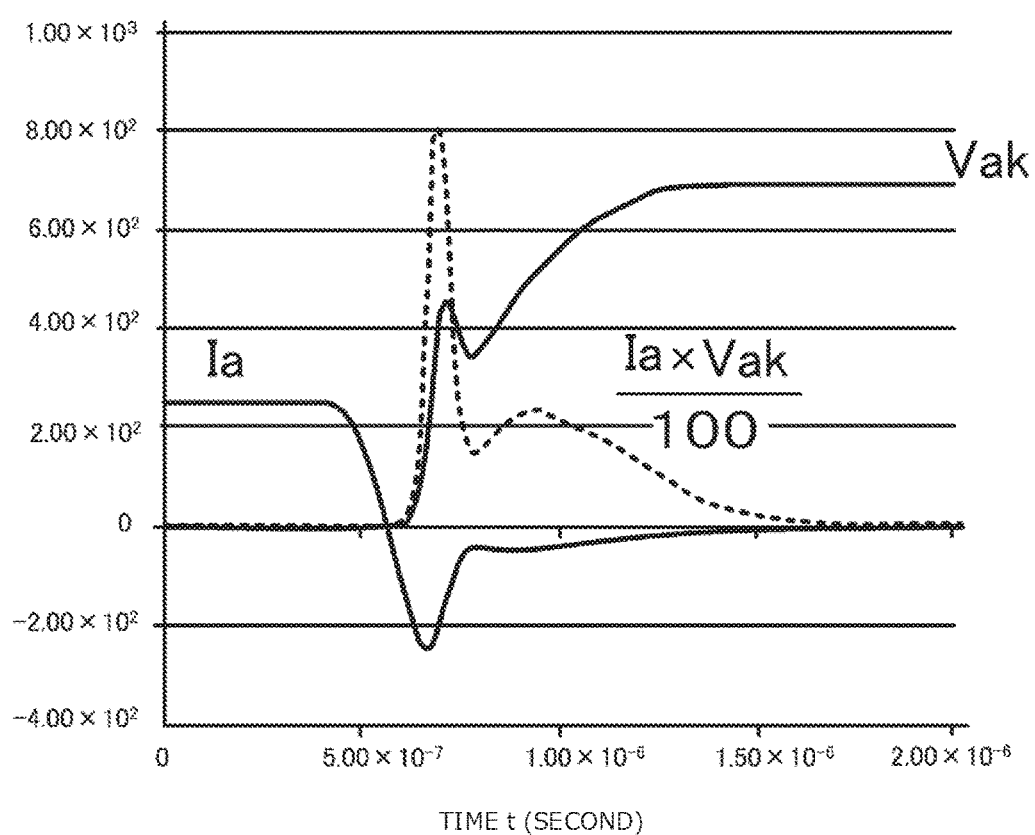

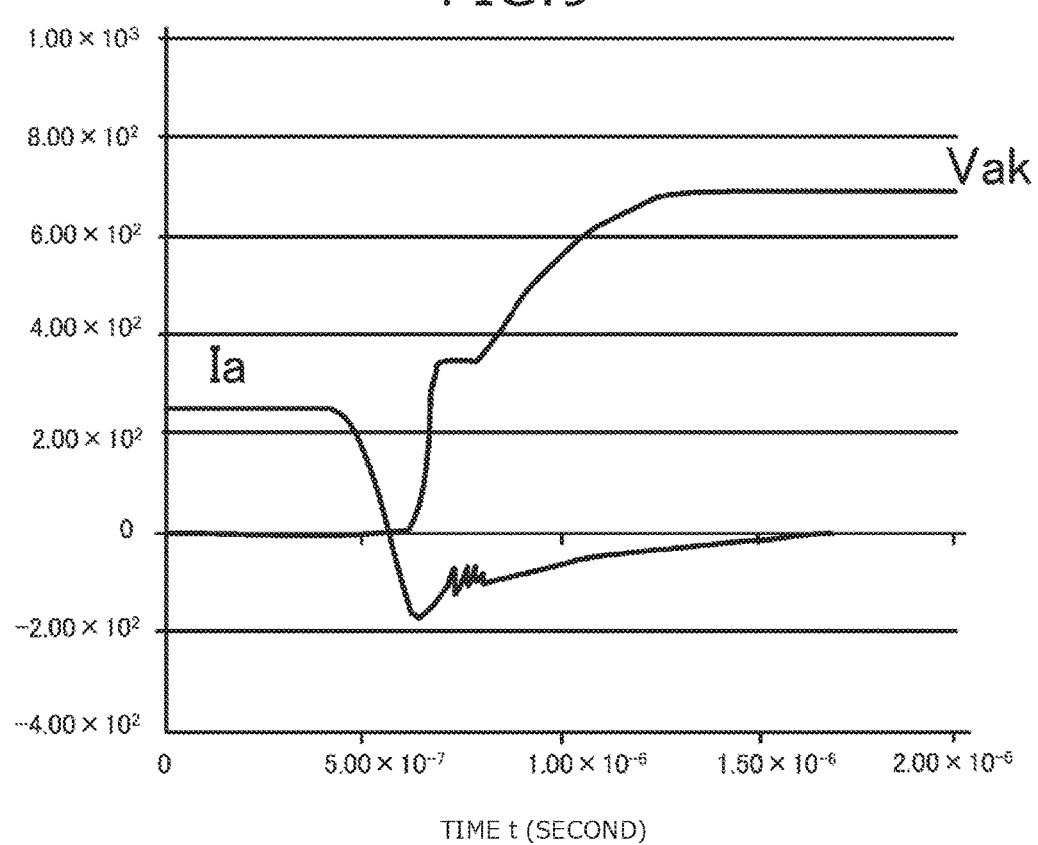

SEMICONDUCTOR DEVICE AND METHOD OF MANUFACTURING THE SEMICONDUCTOR DEVICE

CROSS REFERENCE TO RELATED APPLICATIONS

This is a continuation application of International Application PCT/JP2015/072917 filed on Aug. 13, 2015, which claims priority from Japanese Patent Application No. 2014-180373 filed on Sep. 4, 2014, the contents of which are incorporated herein by reference.

BACKGROUND OF THE INVENTION

1. Field of the Invention

The embodiments discussed herein are related to a power diode used in a power converter and the like, a semiconductor device that has the power diode incorporated therein, and a method of manufacturing a semiconductor device.

2. Description of the Related Art

A freewheeling diode is a semiconductor device used in high-voltage and large-current power converting equipment and the like. Reduction of switching loss and soft recovery characteristics are requisite electrical characteristics at the time of switching of a freewheeling diode. Recently, soft recovery characteristics have been particularly demanded as measures for environmental problems to suppress electromagnetic noise arising from power electronic devices.

FIG. 5 is a cross-sectional view of relevant parts of a semiconductor substrate and depicts a layer structure of a conventional diode and a carrier lifetime control region. As depicted in FIG. 5, a vertical power diode 100 used as a freewheeling diode includes an anode electrode 102 provided on a top surface of an n-type drift layer 101 of high resistivity, and a cathode electrode 103 provided on a bottom surface of the n-type drift layer 101.

The anode electrode 102 forms an ohmic contact with a p-type anode layer 104 formed selectively at a central portion of a top surface side of the n-type drift layer 101. The cathode electrode 103 forms an ohmic contact with an n-type cathode layer 105 formed on the entire surface of a bottom surface side the n-type drift layer 101. The anode layer 104 that the anode electrode 102 contacts is a region associated with a principal current and is referred to as "active portion 109".

An edge termination structure 110 is disposed at an outer periphery of the n-type drift layer 101, surrounding the anode layer 104, on the top surface side of the n-type drift layer 101, i.e., the same side where the anode electrode 102 and the anode layer 104 are disposed. The edge termination structure 110 includes guard rings 107 and field plates (not depicted). When reverse voltage is applied with the anode as a negative electrode, the guard rings 107 have a function of reducing a high electrical field generated at a surface of the substrate at the periphery of a pn junction 106. The field plate has, for example, a function of preventing a change of electrostatic potential induced by external charges.

The edge termination structure 110 has an insulating film 108 in addition to the guard rings 107 and the field plates. The insulating film 108 protects an edge termination surface 106a of the pn junction and a high-field silicon (Si) substrate surface on a side peripheral to the edge termination surface 106a. In the edge termination structure 110, a carrier lifetime control region 111 depicted by hatching is provided near the anode layer 104 of the high-resistance n-type drift layer 101.

FIG. 6 is a general chopper circuit diagram of an insulated-gate bipolar transistor (IGBT) and a diode. While there is a floating inductance Lstray in a closed circuit connecting the diode, the IGBT, and an intermediate capacitor, the floating inductance Lstray is depicted on a part of the circuit in FIG. 6 for the sake of convenience.

FIG. 7 is a reverse-recovery voltage and current waveform chart depicting temporal transitions of voltage and current at the time of switching of a general diode. FIG. 7 depicts reverse-recovery voltage and current waveforms representing transitions of reverse-recovery voltage and current with respect to the time (μs) in a case of turning off the diode operating on the circuit depicted in FIG. 6.

As depicted in FIG. 7, an anode current Iak decreases from a forward current If by a decrease rate di/dt to be commutated in the reverse direction and the reverse current further increases. After having reached a reverse-recovery peak current Irp, the anode current Iak decreases by a current decrease rate dIr/dt and converges to a current value 0. In FIG. 7, an anode-cathode voltage Vak is depicted in the direction of a cathode-anode voltage Vka in which the cathode is positive with respect to the anode, so as to be readily seen.

The anode-cathode voltage Vak changes from a forward voltage VF (not depicted) to a voltage in the reverse direction corresponding to the decrease of the anode current Iak, and the anode-cathode voltage Vak becomes negative (the cathode-anode voltage Vka becomes positive). When the anode current Iak then reaches the reverse-recovery peak current Irp, the cathode-anode voltage Vka has the same value as that of a power supply voltage Vcc. A voltage higher than the power supply voltage Vcc by a product (Lstray×dIr/dt) of the current decrease rate dIr/dt of the anode current Iak and the floating inductance Lstray is thereafter produced, becoming a surge voltage. When the absolute value of the current decrease rate dIr/dt becomes largest, the cathode-anode voltage Vka also has a largest value Vs of the surge voltage. The cathode-anode voltage Vka thereafter converges to the power supply voltage Vcc.

When the diode 100 is to be switched from a state in which the forward current (an anode current) is flowing to a state in which a reverse voltage is blocked at the time of switching the diode, the reverse current flows while the switching is completed, as depicted in the reverse-recovery current and voltage waveform chart of FIG. 7. This is because even when the direction of voltage application is reversed, carriers accumulated in the diode 100 by carrier conductivity modulation remain as residual carriers and become the reverse current during recombination and annihilation or discharge to the outside.

This reverse current is referred to as "recovery current (reverse recovery current)" of the diode. The peak value Irp of the reverse recovery current increases as the current decrease rate (dIr/dt) of the forward current increases. If the peak value Irp of the reverse recovery current becomes large, the switching loss becomes large. In the process of increasing the reverse recovery current, a depletion layer starts extending from the pn junction 106 a short time later and the reverse voltage (a blocking voltage) increases. The increased reverse voltage thereafter converges to a reverse-bias voltage value that is applied externally. Meanwhile, residual excess electrons in the n-type drift layer 101 are eliminated from the cathode electrode 103 through the cathode layer 105 and residual holes are eliminated from the anode electrode 102 through the anode layer 104. Here, the carrier mobility of the holes is lower than that of the electrons and, thus, the decrease rate dIr/dt of the reverse recovery current may be considered to depend on the elimination rate of the residual holes.

When the diode is switched from the forward current state to the reverse blocking-voltage state, the increase rate of the reverse voltage of the diode is larger as the current decrease rate is larger, which causes the electromagnetic noise described above. This is because the reverse voltage of the diode needs to be increased rapidly to eliminate the residual holes quickly in order to maintain the current decrease rate.

The reverse-recovery voltage and current waveform chart depicted in FIG. 7 can be roughly divided into two regions with respect to the time axis (μs) of the horizontal axis. One of the regions is a region A from when the forward current reaches zero until the peak value Irp of the reverse recovery current is reached. The forward current decreases from a steady current by the current decrease rate di/dt, which is determined by the drive frequency of the IGBT, or the like.

During this decrease, the current flowing when the holes remaining in the n-type drift layer 101 are eliminated from the anode electrode 102 is the reverse recovery current. The reverse recovery current increases with an increase of the reverse bias voltage and reaches the peak value Irp of the reverse recovery current. The other region is a region B from the peak value Irp of the reverse recovery current until when the reverse current becomes zero due to elimination of the residual holes from the anode electrode 102 and recombination thereof by the decrease rate (dIr/dt).

The reduction of the switching loss and the soft recovery characteristics demanded for a freewheeling diode have a tradeoff relation and therefore, normally, are not easy achieved concurrently. For example, the reduction of the switching loss is achieved by decreasing the amount of holes injected from the anode layer 104 to decrease the peak value Irp of the reverse recovery current and by increasing the current decrease rate dIr/dt to shorten a reverse recovery time (trr). However, the soft recovery characteristics are achieved by inversely decreasing the reverse-recovery current decrease rate dIr/dt in the region B to lengthen the reverse recovery time (trr). Because the measures for achieving the reduction of the switching loss and the soft recovery characteristics are thus conflicting, both reduced switching loss and soft recovery characteristics are not easily achieved.

To reduce the switching loss at the time of reverse recovery, a method of thinning the n-type high-resistance drift layer within a range in which the breakdown voltage of the device is not lowered, to thereby reduce the residual carriers (holes) is also conventionally used. However, in this case, carries accumulated on the cathode side at the time of reverse recovery are also reduced and thus, the residual carriers on the cathode side annihilate faster (the decrease rate dIr/dt of the reverse recovery current becomes larger). As a result, the surge voltage is increased and oscillation is likely to occur. That is, hard recovery characteristics are likely to result when the decrease rate dIr/dt of the reverse recovery current is large, and the loss becomes large when the decrease rate dIr/dt of the reverse recovery current is too small. Accordingly, it is normally quite difficult to reduce the switching loss while maintaining the soft recovery characteristics.

As described above, achieving both the reduction of the switching loss and the soft recovery characteristics (low noise) requires not only reduction of the amount of holes injected from the anode layer to decrease the peak value Irp of the reverse recovery current but also appropriate control of the duration of life (lifetime) of the injected holes.

For example, a method of forming a region having a short carrier lifetime within a desired depth range in a thickness direction of a Si semiconductor substrate in order to effectively control the residual carriers (holes) is conventionally known. As such a carrier lifetime control method, there is a method in which crystal defects formed by applying or introducing radial rays to a semiconductor are used as carrier recombination centers. While most of the crystal defects are recovered by thermal treatment at 200° C. to 400° C., complex defects associated with oxygen remain. A method of controlling the lifetime to a desired value by controlling the complex defects has conventionally been developed.

A method of thermally diffusing a heavy metal such as platinum into a semiconductor is also conventionally known. This method uses an impurity level formed in a Si band gap by crystal defects that are formed in a semiconductor substrate for carrier lifetime control. However, the carrier lifetime control method using a heavy metal is likely to cause segregation in crystal defects on a Si/oxide-film interface or in crystal defects in a highly-doped region. Therefore, while a region in which the minority carrier lifetime is short can be formed at these locations, a region having a short carrier lifetime is difficult to form at an arbitrary location.

Types of radial rays used for the lifetime control include helium irradiation, proton irradiation, electron beam irradiation, and the like. Among these types, the helium irradiation and the proton irradiation are short in the range in a semiconductor and thus can locally form a region in which the lifetime is controlled to be short and fall within a predetermined depth range. Meanwhile, a high-energy radiation apparatus is quite expensive and is not so high in the practical utility in view of the depth control accuracy when the thickness of a metal masking shield is used for depth control of the irradiation range.

While electron beam irradiation is superior in cost and productivity, the carrier lifetime becomes uniform throughout the semiconductor substrate in the thickness direction because the range in a semiconductor is long. Accordingly, local formation of a carrier lifetime region is difficult. However, after a high-concentration oxygen region is locally formed in advance in a semiconductor substrate, a part of the semiconductor region other than the high-concentration oxygen region is irradiated with an electron beam to such an extent that crystal defects effective for the carrier lifetime control are not formed. With this process, local carrier lifetime control can be provided to some extent by electron beam irradiation (see Japanese Laid-Open Patent Publication No. 2007-266103 listed below, for example).

Other documents related to the reduction of switching loss and soft recovering are described in the following. In particular, for example, one document describes that loss at the time of reverse recovery is reduced to suppress extension of a depletion layer by provision of a carrier capture layer near an intermediate region of a high-resistance region (Japanese Laid-Open Patent Publication No. 2010-92991). Another document describes, for example, that oxygen is introduced and protons are irradiated from an anode-side surface to introduce crystal defects and the crystal defects are recovered to increase a net doping concentration, thereby achieving low loss and soft recovery characteristics (see Domestic Re-publication of PCT International Application, Publication No. 2007-55352 listed below, for example). Another document describes, for example, that platinum is diffused in a high-resistance n-layer and the n-layer is irradiated with helium ions to form a low carrier lifetime region, thereby achieving soft recovering (see International Publication No. 99/09600 listed below, for example).

SUMMARY OF THE INVENTION

According to one aspect of the present invention, a semiconductor device includes a semiconductor substrate of a first conductivity-type; a drift layer of the first conductivity-type, formed on a first principal surface of the semiconductor substrate; an anode layer of a second conductivity-type, formed selectively along the drift layer and having a lower resistance than that of the drift layer; a cathode layer of the first conductivity-type, formed on a surface layer of a second principal surface of the semiconductor substrate and contacting the drift layer; and a vacancy-oxygen complex defect region formed of complex defects of vacancies and oxygen. The vacancy-oxygen complex defect region has a depth R in a direction from a boundary surface between the cathode layer and the drift layer toward the first principal surface of the semiconductor substrate. The vacancy-oxygen complex defect region is provided at the depth R represented by $0<R\leq t-W$, where resistivity of the semiconductor substrate is $\rho$, thickness from a pn junction between the anode layer and the drift layer to the cathode layer is t, and width of a depletion layer extending in the drift layer from the pn junction with a reverse bias voltage V applied to the pn junction is W and represented by $0.54\times\sqrt{/(\rho\times V)}$.

In the semiconductor device, the vacancy-oxygen complex defect region is formed of complex defects including VV defects and VO defects.

In the semiconductor device, the vacancy-oxygen complex defect region includes complex defects functioning as recombination centers formed by diffusion of a heavy metal into the vacancy-oxygen complex defect region.

In the semiconductor device, the heavy metal may be platinum.

The semiconductor device is a device having a second conductivity-type region selectively formed on one of a first principal surface and a second principal surface of the semiconductor substrate and having a resistance that is lower than that of the semiconductor substrate. The device may be one of a diode and a semiconductor device including a diode.

According to another aspect of the invention, a method of manufacturing a semiconductor device including a semiconductor substrate of a first conductivity-type; a drift layer of the first conductivity-type formed on a first principal surface of the semiconductor substrate; an anode layer of a second conductivity-type formed selectively along the drift layer and having a lower resistance than that of the drift layer; a cathode layer of the first conductivity-type formed on a surface layer of a second principal surface of the semiconductor substrate and contacting the drift layer; and a vacancy-oxygen complex defect region formed of complex defects of vacancies and oxygen, where the vacancy-oxygen complex defect region has a depth R in a direction from a boundary surface between the cathode layer and the drift layer toward a first principal surface of the semiconductor substrate, and the vacancy-oxygen complex defect region is provided at the depth R represented by $0<R\leq t-W$, where resistivity of the semiconductor substrate is $\rho$, thickness from a pn junction between the anode layer and the drift layer to the cathode layer is t, and width of a depletion layer extending in the drift layer from the pn junction with a reverse bias voltage V applied to the pn junction is W and represented by $0.54\times\sqrt{/(\rho\times V)}$, is a method that includes forming the vacancy-oxygen complex defect region by locally forming a high-concentration oxygen region comprising high-concentration oxygen, at a predetermined position, by ion implantation of oxygen; and subsequently shortening carrier lifetime by electron beam irradiation.

According to another aspect of the invention, a method of manufacturing a semiconductor device including a semiconductor substrate of a first conductivity-type; a drift layer of the first conductivity-type formed on a first principal surface of the semiconductor substrate; an anode layer of a second conductivity-type formed selectively along the drift layer and having a resistance that is lower than that of the drift layer; a cathode layer of the first conductivity-type formed on a surface layer of a second principal surface side of the semiconductor substrate and contacting the drift layer; and a vacancy-oxygen complex defect region formed of complex defects of vacancies and oxygen, where the vacancy-oxygen complex defect region has a depth R in a direction from a boundary surface between the cathode layer and the drift layer toward a first principal surface of the semiconductor substrate, and the vacancy-oxygen complex defect region is provided at the depth R represented by $0<R\leq t-W$, where resistivity of the semiconductor substrate is $\rho$, thickness from a pn junction between the anode layer and the drift layer to the cathode layer is t, and width of a depletion layer extending in the drift layer from the pn junction with a reverse bias voltage V applied to the pn junction is W and represented by $0.54\times\sqrt{(\rho\times V)}$, is a method that includes forming the vacancy-oxygen complex defect region by locally forming a high-concentration oxygen region comprising high-concentration oxygen, at a predetermined position, by ion implantation of oxygen; and subsequently shortening carrier lifetime by heavy metal diffusion.

Other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is an explanatory diagram depicting reverse recovery characteristics of the diode manufactured by a method of manufacturing according to the first embodiment of the present invention;

FIGS. 4A, 4B, 4C, 4D, 4E, 4F, and 4G depict cross-sectional views of the diode during manufacture according to the first embodiment of the present invention;

FIG. 8 is a diagram depicting reverse recovery characteristics of a diode in which the carrier lifetime of a semiconductor substrate is uniformly controlled by electron beam irradiation; and FIG. 9 is an explanatory diagram depicting reverse recovery characteristics of a diode of a comparative example.

DETAILED DESCRIPTION OF THE INVENTION

Embodiments of a semiconductor device according to the present invention will be described in detail with reference to the accompanying drawings. In the present description and accompanying drawings, layers and regions prefixed with n or p mean that majority carriers are electrons or holes, respectively. Additionally, + or − appended to n or p means that the impurity concentration is higher or lower, respectively, than layers and regions without + or −. In the description of the embodiments below and the accompanying drawings, identical constituent elements will be given the same reference signs and will not be repeatedly described.

In the following descriptions of embodiments and the accompanying drawings, like constituent elements are denoted with like reference signs and redundant descriptions thereof will be omitted. In order to improve viewing or to facilitate understanding of the accompanying drawings described in the embodiments, these drawings are not depicted in precise scale or precise dimensional ratio. In addition, the present invention is not limited to the following descriptions of the embodiments so long as they do not depart from the scope of the invention.

Figure 1:
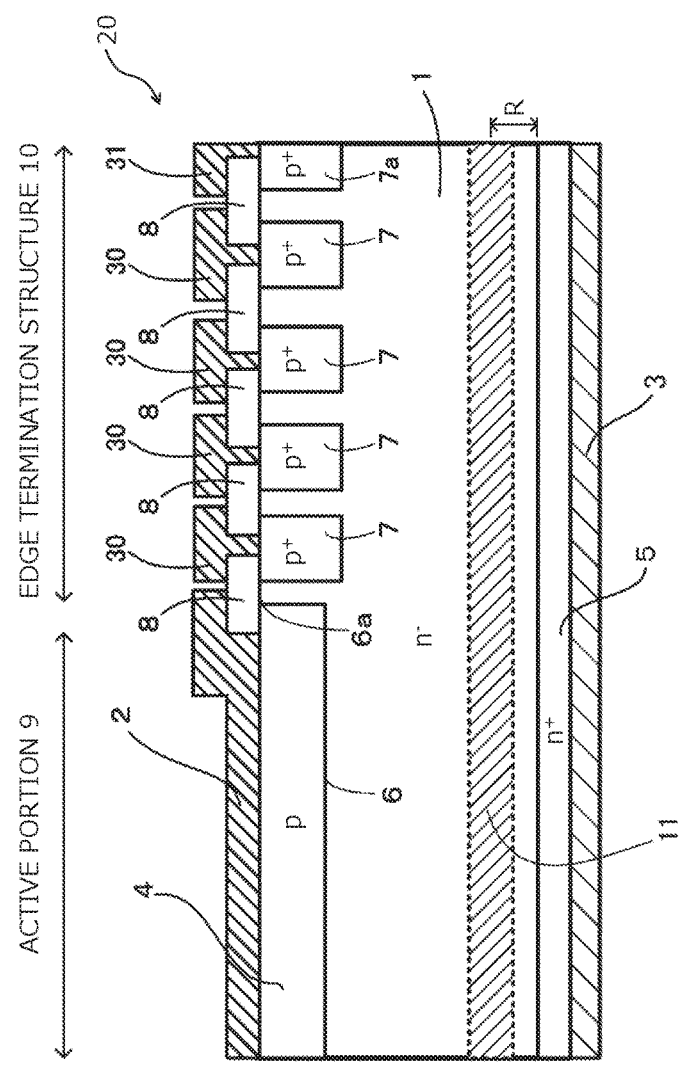
FIG. 1 is a cross-sectional view of relevant parts of a diode according to a first embodiment of the present invention.

A configuration of a diode being a semiconductor device according to a first embodiment of the present invention is first described. FIG. 1 is a cross-sectional view of relevant parts of the diode according to the first embodiment of the present invention. In FIG. 1, a diode 20 according to the first embodiment of the present invention is a vertical power diode and has a pin structure. FIG. 1 depicts the diode 20 having a breakdown voltage rating of 1200 V, for example.

The diode 20 includes a high-resistance n-type drift layer 1 as depicted in FIG. 1. In the first embodiment, a first conductivity-type drift layer according to the present invention can be realized by the n-type drift layer 1. The n-type drift layer 1 is realized by a semiconductor substrate (see reference sign 50 in FIG. 4). Silicon (Si) can be used as the semiconductor substrate. As for the diode 20, silicon carbide (SiC), gallium nitride (GaN), gallium oxide ($Ga_2O_3$), diamond (C), or the like can be used instead of silicon, as the semiconductor substrate.

The diode 20 includes an anode electrode 2 provided on the top surface (a first principal surface, a front surface) of the n-type drift layer 1. The anode electrode 2 forms an ohmic contact with a p-type anode layer 4 formed selectively at a central portion of the top surface side of the n-type drift layer 1. In the first embodiment, a second conductivity-type anode layer according to the present invention can be realized by the p-type anode layer 4. A pn junction 6 is formed at an interface between the p-type anode layer 4 and the n-type drift layer 1.

The diode 20 also includes a cathode electrode 3 provided on the bottom surface (a second principal surface, a back surface) of the n-type drift layer 1. The cathode electrode 3 forms an ohmic contact with an n-type cathode layer 5 formed on the entire surface of the bottom surface side. The n-type cathode layer 5 is formed on a surface layer on the bottom surface side of the n-type drift layer 1 and contacts the n-type drift layer 1. In the first embodiment, a first conductivity-type cathode layer according to the present invention is realized by the n-type cathode layer 5.

An edge termination structure 10 is disposed at an outer periphery of the n-type drift layer 1, surrounding the anode layer 4, on the top surface side of the n-type drift layer 1. The edge termination structure 10 is a region having an insulating film 8 that insulates and protects the surface of an edge end 6a of the pn junction 6 and the surface of the high-field semiconductor substrate (the n-type drift layer 1) an outer peripheral side of the edge end 6a. The edge termination structure 10 has guard rings 7 forming annular p-type layers and during reverse voltage application, has a function of reducing a high electrical field generated at an outer peripheral surface of the substrate surrounding the pn junction 6. The guard rings 7 may have field plates 30. A field plate 30 is a conductive film and is made of, for example, polysilicon or a metal film such as aluminum. Reference sign 31 represents a stopper electrode and reference sign 7a represents a $p^+$-type channel stopper region.

A vacancy-oxygen complex defect region 11 in which the lifetime of minority carriers is shortened as compared to nearby portions is formed on the bottom surface side of the n-type drift layer 1. The vacancy-oxygen complex defect region 11 is formed in the semiconductor substrate (the n-type drift layer 1) at a position that is on the top surface side of the semiconductor substrate (the n-type drift layer 1) relative to an interface between the n-type cathode layer 5 and the n-type drift layer 1, and that is at a depth R relative to the interface.

The vacancy-oxygen complex defect region 11 is a region in which complex defects of oxygen locally introduced to a specific depth of the n-type drift layer 1 by ion implantation and vacancies introduced to the entire n-type drift layer 1 by electron beam irradiation are formed as described below. The oxygen and vacancies introduced to the n-type drift layer 1 become complex defects by heat treatment and become vacancy-oxygen defects (VO defects, hereinafter "VOs") or complexes of di-vacancies (VV defects, hereinafter, "VVs"). Each of the VOs and the VVs has a function of a recombination center for carriers and has an effect to decrease the lifetime of the carriers. The diode 20 may have an identical configuration to that of the conventional vertical power diode 100 described above and the method of manufacturing thereof may be identical to a conventional method.

Figure 2A:
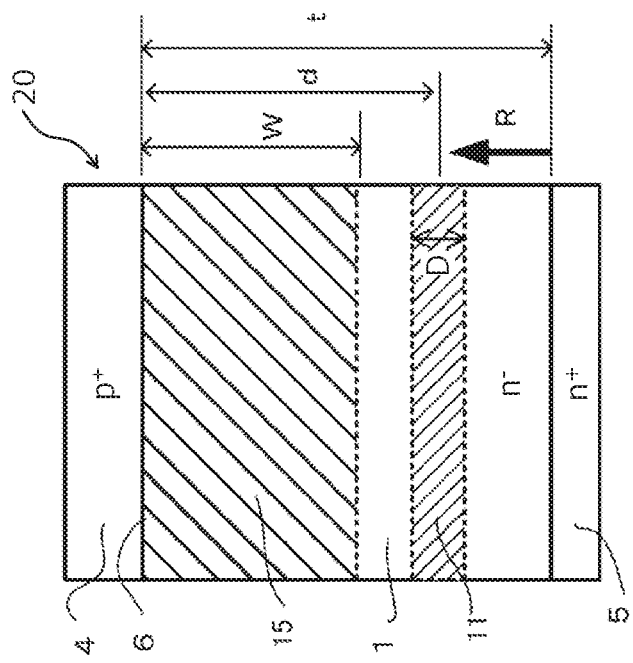
FIGS. 2A, 2B, and 2C are explanatory diagrams depicting a layer structure and characteristics distribution at an active portion 9 of the diode according to the first embodiment of the present invention.
Figure 2B:
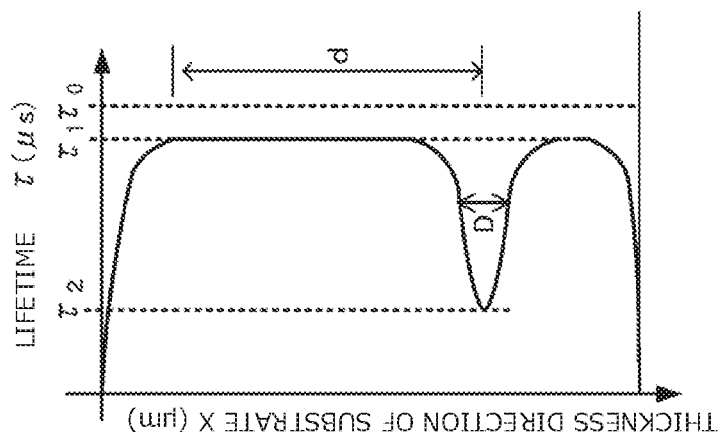
Figure 2C:
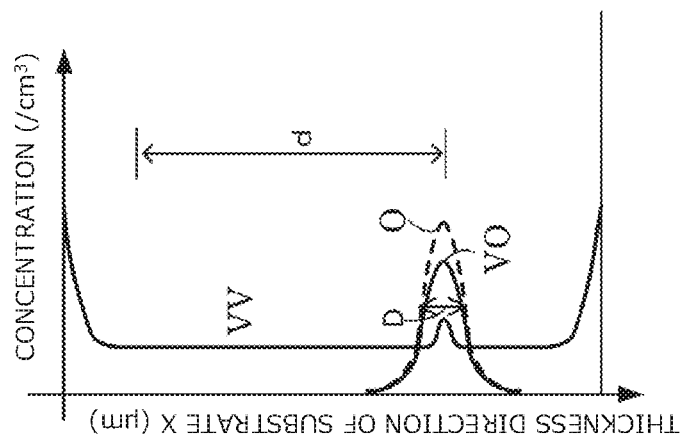
Figure 5:
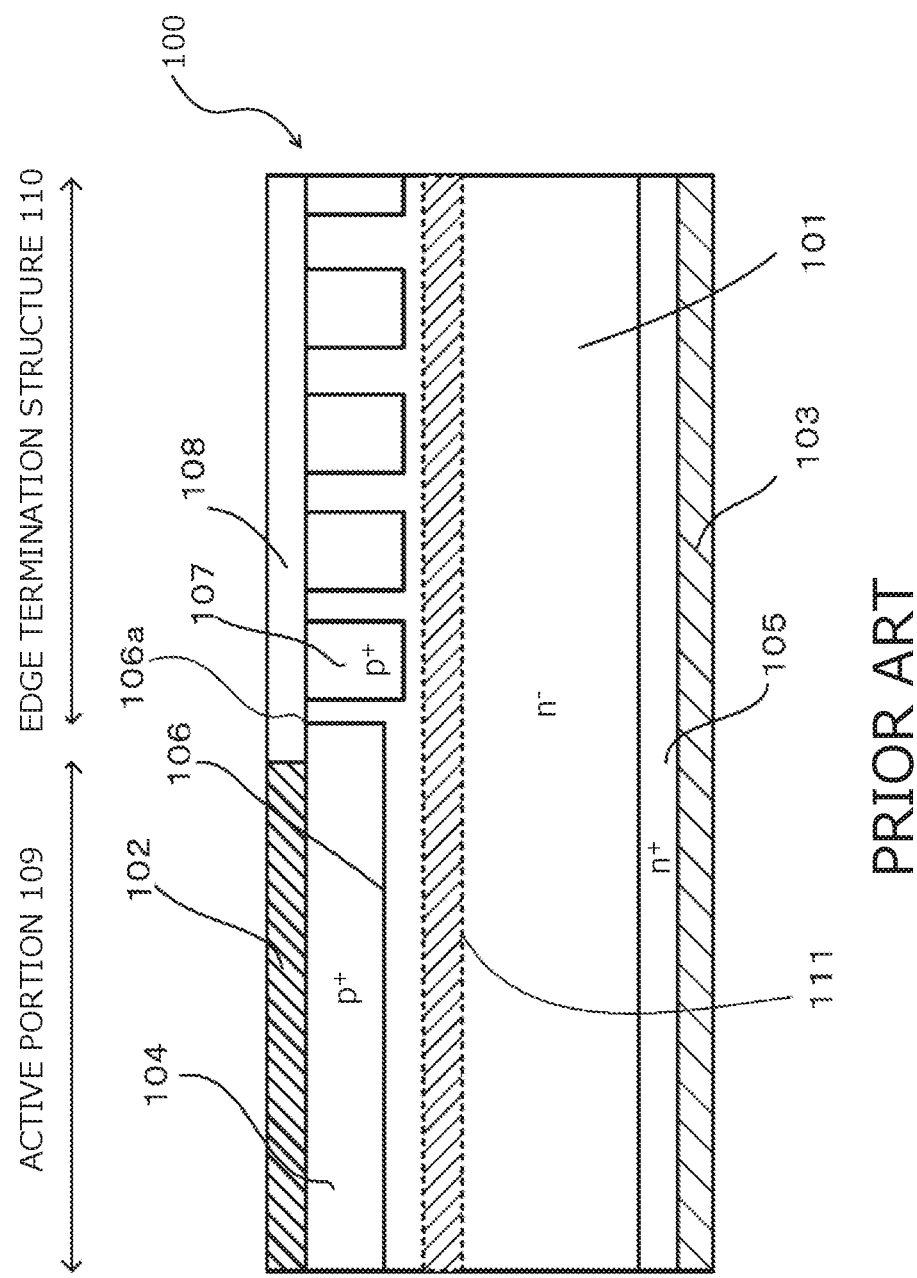
FIG. 5 is a cross-sectional view of relevant parts of a semiconductor substrate and depicts a layer structure of a conventional diode and a lifetime control region.
Figure 6:
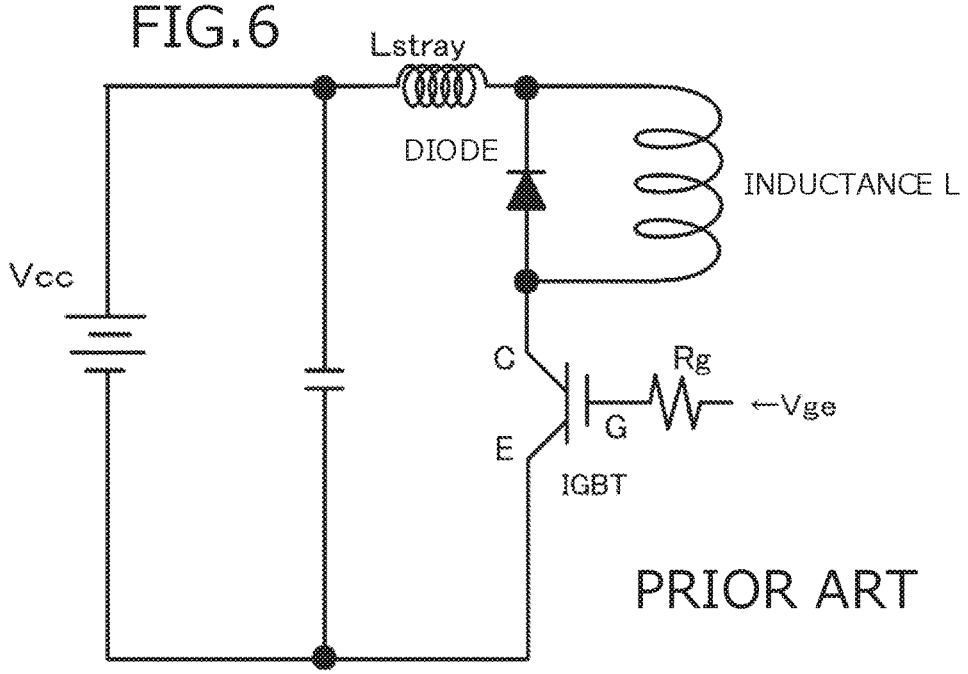
FIG. 6 is a general chopper circuit diagram of an insulated-gate bipolar transistor (IGBT) and a diode.

A layer structure and a characteristics distribution of the vacancy-oxygen complex defect region 11 specific to the diode 20 are described. FIGS. 2A, 2B, and 2C are explanatory diagrams depicting a layer structure and characteristics distribution at an active portion 9 of the diode 20 according to the first embodiment of the present invention. FIG. 2A depicts a cross-sectional view of relevant parts of the layer structure at the active portion 9 of the diode 20.

In FIG. 2A, reference sign d denotes a depth of the vacancy-oxygen complex defect region 11, from the pn junction 6. Reference sign 15 in FIG. 2A denotes a depletion layer extending in the n-type drift layer 1. Reference sign W in FIG. 2A denotes a thickness of the depletion layer 15 in the depth direction, extending in the n-type drift layer 1 when the power supply voltage Vcc is applied to the diode 20 and, accordingly, the cathode-anode voltage Vka becomes Vcc. Reference sign t in FIG. 2A denotes a thickness of the n-type drift layer 1 in the depth direction. The thickness t of the n-type drift layer 1 in the depth direction is a distance from the pn junction 6 to the n-type cathode layer 5. The vacancy-oxygen complex defect region 11 is spaced away from the pn junction 6 by more than the thickness W of the depletion layer 15, toward the n-type cathode layer 5.

FIG. 2B depicts a carrier lifetime distribution in the diode 20 cut at a predetermined position as depicted in the cross section of FIG. 2A. In FIG. 2B, values of the carrier lifetime on the horizontal axis are logarithmic scale values and a point intersecting the depth direction X on the vertical axis does not indicate that the carrier lifetime value is zero.

Assuming that the carrier lifetime of a diode on which carrier lifetime control is not particularly executed is $\tau_0$, the value $\tau_0$ is about 10 to 100 μs. The value $\tau_0$ may be, for example, 20 μs. In contrast, when point defects mainly including vacancies are introduced throughout the semiconductor substrate by electron beam irradiation or the like, the carrier lifetime is reduced from the value $\tau_0$ to a value $\tau_1$. The value $\tau_1$ is appropriately controlled to about 0.01 to 5 μs, for example, according to an irradiation amount of the electron beam or an annealing temperature for crystallinity recovery in order to obtain predetermined characteristics of the diode.

In the first embodiment, the vacancy-oxygen complex defect region 11 is additionally formed at a predetermined depth, so that the carrier lifetime at the formation position of the vacancy-oxygen complex defect region 11 is locally reduced to a value $\tau_2$. The value $\tau_2$ is about 0.001 to 0.1 μs. The carrier lifetimes of the p-type anode layer 4 and the n-type cathode layer 5 that are doped with dopants at high concentrations, respectively, are lower than $\tau_0$.

FIG. 2C depicts a defect concentration distribution in the diode 20 cut at the predetermined position as depicted in the cross section of FIG. 2A. In FIG. 2C, concentrations on the horizontal axis are logarithmic scale values and a point intersecting the depth direction X on the vertical axis does not indicate that the concentration is zero. In the diode 20, as depicted in FIG. 2C, oxygen (O) introduced to the semiconductor substrate by a method described below increases locally at a predetermined depth.

Meanwhile, in the diode 20, the VV defects caused by vacancies introduced by the electron beam irradiation are distributed throughout the depth direction of the semiconductor substrate. The VO defects caused by the vacancies and oxygen are formed by thermal treatment or the like, resulting in a distribution in which the concentration of the VO defects is locally increased. The concentration of the VV defects is also increased at a position (a depth d) where oxygen is introduced. As described above, the vacancy-oxygen complex defect region 11 is a complex defect region including the VV defects and the VO defects.

The relation of the concentrations of the VV, VO, and O in the vacancy-oxygen complex defect region 11 is not limited to that depicted in FIG. 2C. The relative relation of concentrations of the VV, VO, and O in the vacancy-oxygen complex defect region 11 may be changed according to formation conditions. For example, the VV defects may have a higher concentration than that of the VO defects. Alternatively, the VO defects may serve as a donor to locally increase the doping concentration of the n-type drift layer 1. In this case, a position where the doping concentration is locally increased due to the donor of the VO defects may be an n-type field stop layer. The n-type field stop layer has the effect of suppressing extension of the depletion layer.

The vacancy-oxygen complex defect region 11 of the present invention is further characterized in the formation position. Assuming that the resistivity of the n-type semiconductor substrate associated with the diode 20 is ρ, the reverse bias voltage of the pn junction 6 is V, the thickness from the pn junction 6 of the n-type drift layer 1 made of a substrate in the same state as the n-type semiconductor substrate is t, and the depth of the vacancy-oxygen complex defect region 11 from the pn junction 6 is d, then the length R from the n-type cathode layer 5 to the vacancy-oxygen complex defect region 11 is represented as R=t−d.

When the width W of the depletion layer 15 extending from the pn junction 6 in the n-type drift layer 1 is represented as W=0.54×√/(ρ×V), the relation of W, d, and t is represented as W≤d<t. The length R from the n-type cathode layer 5 to the vacancy-oxygen complex defect region 11 is represented as 0<R≤t−W. Provision of the vacancy-oxygen complex defect region 11 with the center at a position of the depth R relative to the n-type cathode layer 5 enables the diode 20 to sufficiently reduce the switching loss and to also provide the soft recovery characteristics.

The vacancy-oxygen complex defect region 11 is typically a region having a width D in the depth direction of the semiconductor substrate as depicted in FIGS. 2A, 2B, and 2C. The width D may be a distribution width of the oxygen concentrations in the vacancy-oxygen complex defect region 11 as will be described later, and may be a full width half maximum (FWHM) when the distribution of the oxygen concentrations is a distribution such as the Gaussian distribution.

When the switching loss is intended to be reduced only by decreasing the peak value Irp of the reverse recovery current as in the conventional carrier lifetime control described in Japanese Laid-Open Patent Publication No. 2007-266103, it is difficult to sufficiently reduce the switching loss while obtaining the soft recovery characteristics. Accordingly, the present invention has been achieved in view of the need for a further improvement to appropriately control the duration of life (lifetime) of injected holes as well as to reduce the peak value Irp of the reverse recovery current.

As described with reference to FIG. 8 described above, when comparison of the waveform of the forward current Iax and the reverse voltage Vak is performed according to time integration, the area in the time integral of the peak with a long duration is more than twice as large as that of the peak with a short duration. That is, when not only the peak value Irp is reduced but also the reverse-current decrease rate dIr/dt in the region B depicted in FIG. 7 described above is slightly increased (speeded up), the switching loss can be reduced further.

Figure 7:
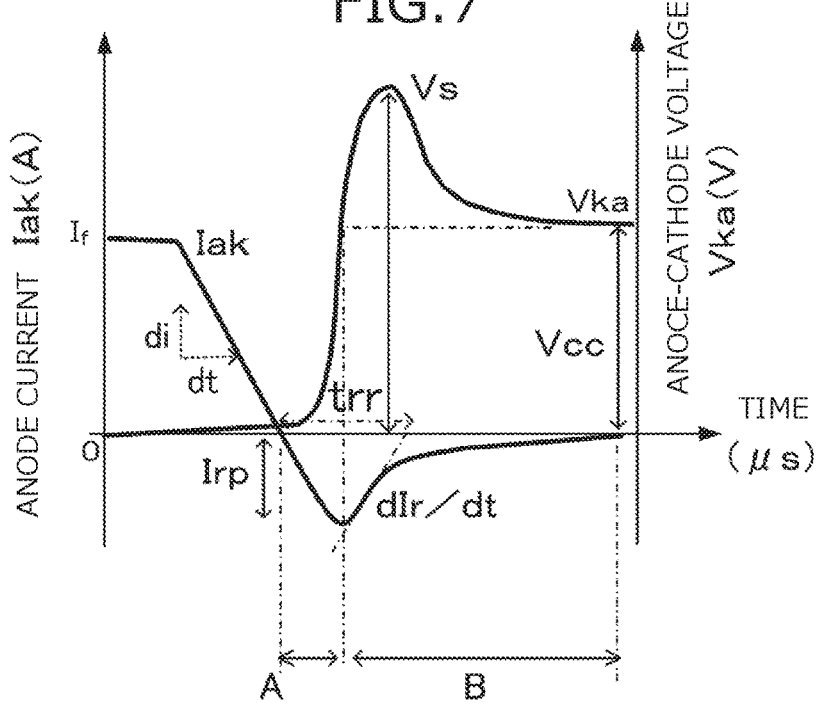
FIG. 7 is a reverse-recovery voltage and current waveform chart depicting temporal transitions of voltage and current at the time of switching of a general diode.

Accordingly, it suffices to reduce the residual holes in the region B at the time of switching in order to increase (speed up) the reverse-current decrease rate dIr/dt in the region B depicted in FIG. 7 described above. However, if the residual holes in the region B are excessively reduced, the operating resistivity (the forward voltage Vf) may be increased. Therefore, the diode 20 is adjusted to shorten the lifetime of only the residual holes located outside the maximum depletion-layer width at a rated voltage of the diode to reduce the residual holes. This enables the diode 20 to provide an effect that the switching loss is sufficiently reduced, the soft recovery characteristics are also obtained, and the forward voltage (Vf) is less likely to increase.

As a method of manufacturing a semiconductor device according to the present invention, a method of manufacturing the diode 20 according to the first embodiment is described. FIGS. 4A thru 4G depict cross-sectional views of the diode 20 during manufacture according to the first embodiment of the present invention. In the first embodiment, the rated voltage of the diode 20 is assumed to be 1200 V. However, the present invention is not limited to this rated voltage. The method of manufacturing is described below according to the sequence of processes.

First, the semiconductor substrate 50 made of silicon is prepared as depicted in FIG. 4A. As the semiconductor substrate 50, for example, an n-type Si semiconductor substrate having a thickness of 130 μm and a resistivity of 55 Ωcm, and manufactured by a float zone (FZ) method is used. The semiconductor substrate 50 realizes the n-type drift layer 1. The semiconductor substrate 50 is not limited to that manufactured by the FZ method and may be a semiconductor substrate manufactured by a Czochralski (CZ) method or a magnetic field applied Czochralski (MCZ) method. In the first embodiment, the semiconductor substrate 50 may implement a first conductivity-type semiconductor substrate according to the present invention.

For a semiconductor substrate having a diameter of 8 inches or larger, the MCZ method is advantageous because the method is easy to perform and can provide a concentration distribution with a high accuracy. Particularly, a semiconductor substrate manufactured by the CZ method or the MCZ method contains a larger amount of oxygen than a semiconductor substrate manufactured by the FZ method. While the average oxygen concentration of a semiconductor substrate manufactured by the FZ method is equal to or lower than $1\times10^{15}/cm^3$, the average oxygen concentration of a semiconductor substrate manufactured by the CZ method or the MCZ method is equal to or higher than $1\times10^{16}/cm^3$. Particularly, the average oxygen concentration of a semiconductor substrate manufactured by the MCZ method is equal to or higher than $1\times10^{17}/cm^3$. Therefore, the vacancy-oxygen complex defect region 11 in the diode 20 according to the first embodiment of the present invention can be easily formed.

Next, the p-type anode layer and the edge termination structure 10 are formed in a front surface 50a of the semiconductor substrate 50 as depicted in FIG. 4B. An oxide film 8 having a function of an insulating film is formed on a surface of the edge termination structure 10 by a thermal oxidation or deposition method. The anode electrode 2 being in contact with the p-type anode layer 4, a surface passivation film, and the like are further formed, so that a surface structure is completed.

Subsequently, the thickness of the semiconductor substrate 50 is thinned as depicted in FIG. 4C. The thickness of the semiconductor substrate 50 is thinned from a back surface 50b of the semiconductor substrate 50 by a method such as back grinding, back surface etching, or a combination thereof. This enables the semiconductor substrate 50 to be thinned from the back surface 50b before thinning to a ground surface denoted by reference sign 52 in a direction indicated by arrow 51 in FIG. 4C.

Next, a high-concentration oxygen region 54 is formed as depicted in FIG. 4D. The high-concentration oxygen region 54 is formed, for example, by introducing oxygen inside the semiconductor substrate 50 by ion implantation from the ground surface 52 of the semiconductor substrate 50 as indicated by reference sign 53.

Subsequently, a vacancy formation region 55 is formed in the entire semiconductor substrate 50 as depicted in FIG. 4E. The vacancy formation region 55 may be formed, for example, by performing electron beam irradiation 12 from the front surface of the semiconductor substrate 50. The electron beam irradiation 12 may be performed from the back surface of the semiconductor substrate 50.

Next, the vacancy-oxygen complex defect region 11 is formed as depicted in FIG. 4F. The vacancy-oxygen complex defect region 11 is formed, for example, by thermally treating (annealing) the semiconductor substrate 50 at a predetermined temperature of a range from 300 to 400° C. In this case, an oxygen passage region 56 depicted in FIG. 4F may have a higher oxygen concentration than that of the n-type drift layer 1 through which oxygen does not pass, and may have slightly more VO defects than the n-type drift layer 1.

At the process depicted in FIG. 4F, the n-type cathode layer 5 having a higher concentration than that of the n-type drift layer 1 is also formed. The n-type cathode layer 5 with a higher concentration than that of the n-type drift layer 1 is formed, for example, by introducing an n-type dopant such as phosphorus to the ground surface 52 by ion implantation and electrically activating the introduced n-type dopant by laser annealing or the like.

Finally, the cathode electrode 3 is formed on the ground surface 52 as depicted in FIG. 4G. The cathode electrode 3 is formed to contact the n-type cathode layer 5 on the ground surface 52.

The diode 20 having the rated breakdown voltage of 1200 V is used in a power converter having a power supply voltage of 600 V, for example. Accordingly, assuming that the resistivity ρ=55 Ωcm and V=600 V, the width W of the depletion layer 15 extending from the bottom of the p-type anode layer 4 in the n-type drift layer 1 is expressed by an equation: $w=0.54\times\sqrt{(\rho V)}$ and thus, $W=0.54\times\sqrt{(55\times600)}=98$ μm. Assuming that the thickness of the n-type drift layer 1 from the surface of the pn junction 6 is t and the depth of the vacancy-oxygen complex defect region 11 is d, the depth at which the vacancy-oxygen complex defect region 11 is formed is expressed as W≤d<t.

When this is applied to the diode 20 according to the first embodiment of the present invention, the depth at which the vacancy-oxygen complex defect region 11 is provided is of a range from 98 μm to 130 μm from the bottom (the pn junction 6) of the p-type anode layer 4. In the diode 20 depicted in FIGS. 2A, 2B, and 2C, the vacancy-oxygen complex defect region 11 having the oxygen concentration of $4\times10^{17}$ cm$^3$ is formed by oxygen ion implantation at a depth of 100 μm from the bottom (the pn junction 6) of the p-type anode layer 4 and with a width of 5 μm.

Because the oxygen implantation depth from the ground surface 52 is 20 μm (=130-110 μm), acceleration energy when oxygen is ion implanted is about 30 MeV. This acceleration energy is obtained by a linear accelerator, a cyclotron accelerator, or the like. At this time, the FWHM in the depth direction (an implantation direction) is 0.7 μm. However, oxygen is slightly diffused by thermal treatment and thus, the distribution width of oxygen becomes about 1.0 μm. Accordingly, the width D of the vacancy-oxygen complex defect region 11 becomes about 1.0 to 2.0 μm.

Because lattice defects in the n-type cathode layer 5, the n-type drift layer 1, and the vacancy-oxygen complex defect region 11 through which oxygen passes from the back surface of the semiconductor substrate are damaged by the oxygen ion implantation, the width D of the vacancy-oxygen complex defect region 11 is further widened and may be considered to be about 2.0 to 10 μm.

The dose amount of oxygen to be ion implanted may be, for example, $1\times10^{11}/cm^2$ to $1\times10^{14}/cm^2$. In this case, the maximum oxygen concentration in the vacancy-oxygen complex defect region 11 at the depth R from the n-type cathode layer 5 may be $1\times10^{16}/cm^2$ to $1\times10^{19}/cm^2$. The concentration of the VO defects may be a similar level to the oxygen concentration, or may be $1\times10^{14}/cm^2$ to $1\times10^{17}/cm^2$, for example, because the concentration becomes lower than the oxygen concentration due to combination with vacancies. Furthermore, the concentration of the VV defects in the vacancy-oxygen complex defect region 11 may be, for example, $1\times10^{14}/cm^2$ to $1\times10^{17}/cm^2$. The concentration of the VV defects in the vacancy-oxygen complex defect region 11 may be lower or higher than that of the VO defects.

While explanations are omitted in the processes depicted in FIG. 4A thru 4G, the p-type guard rings 7 of the diode 20 are formed by ion implantation and drive diffusion of boron at an acceleration voltage of 50 kV and with a dose amount of $1.3\times10^{13}$ cm$^{-2}$ using an oxide film (not depicted) as a mask. Furthermore, the p-anode layer 4 of the diode 20 is formed by ion implantation and drive diffusion of boron at an acceleration voltage of 50 kV and with a dose amount of $1\times10^{13}$ cm$^{-2}$ using an oxide film (not depicted) as a mask. Depths of the p-anode layer 4 and the p-guard rings 7 are about 3 μm and about 4 μm, respectively.

The pn junction 6 is formed at a boundary between the p-type anode layer 4 and the n-type drift layer 1. The p-type guard rings 7 are provided outside the edge end 6a of the pn junction intersecting the Si semiconductor substrate surface at a predetermined interval, respectively, so as to surround the p-type anode layer 4. The oxide film 8 is coated on surfaces between the edge end 6a of the pn junction and the guard ring 7 and between the guard rings.

The electron beam irradiation 12 and thermal treatment are performed thereafter to adjust the carrier lifetime. An electron beam irradiation amount is 60 kGy at an acceleration voltage of 4.2 MeV and thermal treatment for reducing the crystal defects is performed for one hour at 360° C. The acceleration voltage of the electron beam irradiation may be about 1 to 8 MeV and the electron beam irradiation amount may be about 20 to 600 kGy. The n-type cathode layer 5 is formed by implanting ions of phosphorus with a dose amount of $1\times10^{15}$ cm$^2$ from the back surface and then diffusing phosphorus to a depth of 0.5 μm.

The anode electrode 2 is formed of an Al—Si film and the cathode electrode 3 is formed of Ti, Ni, and Au, and both are formed by vacuum deposition. Although not depicted, the field plates 30 may be disposed. The field plates 30 are formed at the same time as the anode electrode film and contact respective surfaces of the guard rings 7 through openings of the oxide film 8. Regions, layers, electrode films, and the like other than the vacancy-oxygen complex defect region 11 may be formed appropriately by other known techniques other than those described above.

FIG. 3 is an explanatory diagram depicting reverse recovery characteristics of the diode 20 manufactured by the method of manufacturing according to the first embodiment of the present invention. FIG. 9 is an explanatory diagram depicting reverse recovery characteristics of a diode of a comparative example. The diode of the comparative example has a high-concentration oxygen region formed at a position 5 μm below the p-type anode layer 4 and formed as a vacancy-oxygen complex defect region by the electron beam irradiation 12 for comparison with the diode 20.

Other manufacturing conditions of the comparative diode were the same as those of the diode 20. As depicted in FIGS. 3 and 9, the switching loss of the diode of the comparative example was 42 mJ while the switching loss of the diode 20 was 26 mJ. It can be seen that while the spike-like surge voltage is suppressed and also the soft recovery characteristics are achieved in both the diode 20 and the diode of the comparative example, the switching loss is further lowered in the diode 20 as compared to the diode of the comparative example. Furthermore, it was also confirmed that no forward voltage drop (Vf) failure occurs in the diode 20.

A diode according to a second embodiment of the present invention is described. The diode according to the second embodiment of the present invention has the vacancy-oxygen complex defect region 11 of the diode 20 according to the first embodiment described above, the vacancy-oxygen complex defect region 11 being manufactured by thermal diffusion of platinum instead of the electron beam irradiation. Processes performed before the process of thermal diffusion of platinum may be the same as those in the first embodiment described above.

To manufacture the diode according to the second embodiment, a paste containing 1 wt % of platinum based on total weight of the paste is coated on the back surface of the semiconductor substrate 50 before the n-type cathode layer 5 is formed and then thermal treatment for 3 hours at 1000° C. is performed, so that platinum is thermally diffused into the semiconductor substrate 50. This thermal diffusion causes platinum to be diffused to about 25 μm from the back surface of the semiconductor substrate 50 and forms crystal defects in the high-concentration oxygen region formed at a position about 20 μm away from the back surface. Therefore, the vacancy-oxygen complex defect region 11 can be obtained.

The diode 20 including the vacancy-oxygen complex defect region 11 manufactured by the method described in the second embodiment had a switching loss of 28 mJ and also provided the soft recovery characteristics. Furthermore, it was confirmed that no forward voltage drop (Vf) failure occurs in the diode manufactured by the method described in the second embodiment.

However, the conventional technique described in Japanese Laid-Open Patent Publication No. 2007-266103 mentioned above further describes that the switching loss can be reduced while effects on operating resistivity (a forward-voltage drop value Vf) is kept smaller than in a case where only electron beam irradiation that forms crystal defects throughout the thickness direction is used. That is, this conventional technique is considered as a technique that decreases loss while reducing effects on the operating resistivity by shortening only the lifetime of carriers near the anode side to decrease the peak value Irp of the reverse recovery current and maintaining other residual carriers as they are.

FIG. 8 is a diagram depicting reverse recovery characteristics of a diode in which the lifetime of a semiconductor substrate is uniformly controlled by electron beam irradiation. FIG. 8 depicts FIG. 7 to which a temporal transition waveform of the anode current (Ia)×the anode-cathode voltage (Vak) is represented by a dotted line is added. In FIG. 8, a surface integral obtained by integration with the time on the horizontal axis, which has a waveform represented by the dotted line, indicates a power energy amount, that is, a switching loss.

As can be seen from FIG. 8, the switching loss due to the reverse recovery current has two peaks. The first peak is a peak of a spike-like voltage with a short duration caused by the peak value Irp of the reverse recovery current and the second peak is a peak with a long duration corresponding to a tail (dIr/dt) portion of the reverse current after the peak value Irp. When compared by time integral, the area in the time integral of the peak with the long duration is twice as large as that of the peak with the short duration.

That is, reduction of the switching loss is achieved more effectively by an increase (speeding-up) of the current decrease rate dIr/dt than by a decrease of the peak value Irp. In other words, there is a problem in that there is a limit on the reduction of the switching loss in the technique using only a decrease of the peak value Irp of the reverse recovery current as described in Japanese Laid-Open Patent Publication No. 2007-266103 mentioned above.

As described, the diode 20 described in the first or second embodiment provides both reduction of the switching loss and the soft recovery characteristics without increasing the operating resistivity, and can be obtained at a low cost and by a simple process.

With the semiconductor device and the method of manufacturing of the semiconductor device according to the present invention, reduction of the switching loss and the soft recovery characteristics are both provided at a low cost and by a simple process.

As described above, the semiconductor device and the method of manufacturing of a semiconductor device according to the present invention are useful for a power diode used in power converting equipment and the like, a semiconductor device having the power diode incorporated therein, and a method of manufacturing of a semiconductor device, and are particularly suitable for a power diode used in high-voltage and large-current power converting equipment and the like, a semiconductor device having the power diode incorporated therein, and a method of manufacturing of a semiconductor device.

Although the invention has been described with respect to specific embodiments for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device including a semiconductor substrate of a first conductivity-type; a drift layer of the first conductivity-type formed on a first principal surface side of the semiconductor substrate; an anode layer of a second conductivity-type formed selectively along the drift layer and having a resistance that is lower than that of the drift layer; a cathode layer of the first conductivity-type formed on a surface layer of a second principal surface of the semiconductor substrate and contacting the drift layer; and a vacancy-oxygen complex defect region formed of complex defects of vacancies and oxygen, where the vacancy-oxygen complex defect region has a depth R in a direction from a boundary surface between the cathode layer and the drift layer toward a first principal surface of the semiconductor substrate, and the vacancy-oxygen complex defect region is provided at the depth R represented by $0 < R \le t - W$ where resistivity of the semiconductor substrate is $\rho$, thickness from a pn junction between the anode layer and the drift layer to the cathode layer is t, and width of a depletion layer extending in the drift layer from the pn junction with a reverse bias voltage V applied to the pn junction is W and represented by $0.54 \times \sqrt{(\rho \times V)}$, the method comprising:

forming the vacancy-oxygen complex defect region by:
locally forming a high-concentration oxygen region comprising oxygen having a high-concentration, at a predetermined position, by ion implantation of oxygen; and
subsequently shortening carrier lifetime by electron beam irradiation.

2. A method of manufacturing a semiconductor device including a semiconductor substrate of a first conductivity-type; a drift layer of the first conductivity-type formed on a first principal surface of the semiconductor substrate; an anode layer of a second conductivity-type formed selectively along the drift layer and having a resistance that is lower than that of the drift layer; a cathode layer of the first conductivity-type formed on a surface layer of a second principal surface of the semiconductor substrate and contacting the drift layer; and a vacancy-oxygen complex defect region formed of complex defects of vacancies and oxygen, where the vacancy-oxygen complex defect region has a depth R in a direction from a boundary surface between the cathode layer and the drift layer toward a first principal surface of the semiconductor substrate, and the vacancy-oxygen complex defect region is provided at the depth R represented by $0 < R \le t - W$, where resistivity of the semiconductor substrate is $\rho$, thickness from a pn junction between the anode layer and the drift layer to the cathode layer is t, and width of a depletion layer extending in the drift layer from the pn junction with a reverse bias voltage V applied to the pn junction is W and represented by $0.54 \times \sqrt{(\rho \times V)}$, the method comprising:

forming the vacancy-oxygen complex defect region by:
locally forming a high-concentration oxygen region comprising oxygen having a high-concentration, at a predetermined position, by ion implantation of oxygen; and
subsequently shortening carrier lifetime by heavy metal diffusion.

* * * * *